United States Patent [19]

Bruno et al.

[11] Patent Number: 5,155,072
[45] Date of Patent: Oct. 13, 1992

[54] HIGH K DIELECTRIC COMPOSITIONS WITH FINE GRAIN SIZE

[75] Inventors: Salvatore A. Bruno, Wilmington; Ian Burn, Hockessin, both of Del.

[73] Assignee: E. I. Du Pont de Nemours and Company, Wilmington, Del.

[21] Appl. No.: 564,586

[22] Filed: Jun. 29, 1990

[51] Int. Cl.$^5$ ............................................. C04B 35/46
[52] U.S. Cl. ................................... 501/138; 501/139
[58] Field of Search ....................... 501/137, 138, 139

[56] References Cited

U.S. PATENT DOCUMENTS

| | | | |
|---|---|---|---|
| 4,463,984 | 2/1987 | Abe et al. | 501/134 |
| 4,640,905 | 2/1987 | Burn | 501/137 |
| 4,820,668 | 4/1989 | Kato et al. | 501/134 |
| 4,829,033 | 5/1989 | Menashi et al. | 501/136 |
| 4,855,266 | 8/1989 | Burn | 501/137 |

OTHER PUBLICATIONS

3rd European Capacitor and Resistor Technology Symposium (CARTS), Amsterdam, Oct. 9-11, 1989.
Journal of Materials Science, vol. 23, p. 3980, "The Curie Point Temperature of Ba(Ti$_{1-x}$Zr$_x$)O$_3$ Solid Solutions", Stephen M. Neirman, (1988).
"Square Loop Ba(Ti,Zr)O$_3$ Capacitors Based on Alkoxide Derived (Ti,Zr)O$_2$ Powders", First International Conference on Ceramic Powder Processing Science: Orlando, Fla., Nov. 1-4, 1987, Paper No. 103-BP-87F.

Primary Examiner—Mark L. Bell
Assistant Examiner—Anthony J. Green

[57] ABSTRACT

A composition comprising finely divided particles of modified barium titanate; and an admixture of calcium, titanium and manganese; the modified barium titanate particles containing Zr, Zn and Nb homogeneously distributed on an atomic scale throughout the particles according to the formula:

$$BaTi_{1-(x+3y/2)}(Zr_xZn_{y/2}Nb_y) O_3$$

wherein x=0.01-0.20 and y=0.005-0.075. This composition forms a dielectric layer having a Curie Temperature below 25° C., a dielectric constant of at least 10,000 and grain size of 5 microns or less and is useful in multi-layer electrical devices such as circuits and capacitors.

7 Claims, No Drawings

HIGH K DIELECTRIC COMPOSITIONS WITH FINE GRAIN SIZE

FIELD OF THE INVENTION

The invention is related to barium titanate-based compositions which form ceramic bodies with small grain size and high dielectric constant.

BACKGROUND OF THE INVENTION

There is a continuing need to decrease the size of multilayer ceramic capacitors (MLC's) in order to use less space on circuit boards and to reduce costs. A decrease in size and cost can be achieved by developing ceramic materials with higher dielectric constant (K) and by manufacturing MLC's with thinner dielectric layers, typically 25 microns or less. While ceramic dielectrics with K of 15,000 or more are known, these are usually based on high lead materials such as lead magnesium niobate, or lead iron niobate and the like. Apart from the potential health hazard of processing powders with a high lead content, these materials also tend to have certain undesirable properties for MLC applications, such as relatively low mechanical strength, low chemical durability, and low K at MHz frequencies.

High dielectric constant materials based on barium titanate are also known (e.g. Burn, Raad and Sasaki, Proceedings of the Capacitor and Resistor Technology Symposium (CARTS), Amsterdam 1989). However, grain size is typically more than 5 microns, so that across each dielectric layer there exists a number of grains insufficient to achieve high reliability if the layer thickness is less than 25 microns. High dielectric constants with small grain sizes have been reported for solid solutions of barium titanate and barium zirconate made by wet chemical processing such as hydrothermal (Neirman, J. Mats. Sc. Vol. 23, p. 3980, 1988) or alkoxide (Mc Sweeney, Proc. First Int. Conf. on Ceramic Powder Processing Science, Orlando Fl., 1987). These solid solution compositions are not suitable for MLC's with thin layers because the Curie peak (or Curie Temperature) is above 25° C. and the variation in dielectric constant with temperature is too large. Compositions with a Curie Temperature above 25° C. have a dissipation factor unsuitably high for MLC's with thin layers. Thus, there is still a need for a barium titanate-based ceramic dielectric material that has a high dielectric constant, a fine grain size and a Curie Temperature below 25° C.

PRIOR ART

U.S. Pat. No. 4,640,905 (Burn) describes barium titanate-based dielectrics corresponding to the formula

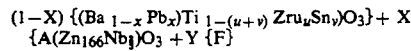

where A is selected from Pb, Ba and mixtures thereof, F is a manganese-doped zinc borate flux, and x, u and v = 0 to 0.125. Dielectric constants as high as 10,300 are disclosed.

U.S. Pat. No. 4,855,266 (Burn) discloses barium titanate-based compositions suitable for use in multilayer ceramic capacitors with copper electrodes. The barium titanate includes both donor and acceptor additives and a flux phase. Use of doped barium titanate containing Zr, Zn and Nb is included. Dielectric constants as high as 9000–10,000 were obtained.

U.S. Pat. No. 4,820,668 (Kato et al.) describes a barium titanate-based dielectric with K of 12,000 and fired grain size of 0.8–1 micron. The dielectric powder contains Ca, Zr, Sn, Bi, Y, and Pb dopants and is precipitated from an aqueous solution of barium chloride, titanium chloride and the dopants.

U.S. Pat. Nos. 4,829,033 (Menashi et al.) and 4,643,984 (Abe et al.) disclose complex perovskite materials comprising doped barium titanate made by hydrothermal processing.

SUMMARY OF THE INVENTION

The invention is directed to a composition for forming a densified dielectric body having a dielectric constant of at least 10,000, a Curie Temperature below 25° C., and a grain size of 5 microns or less. In its primary aspect, the invention is directed to a composition comprising (a) finely divided particles of modified barium titanate; and (b) an admixture of (1) oxides of calcium and titanium, precursors thereof, or calcium titanate and (2) manganese oxide, precursors thereof, barium manganate or calcium manganate;

the modified barium titanate particles containing dopants of Zr, Zn and Nb homogeneously distributed throughout the particles on an atomic scale according to the chemical formula

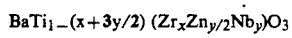

where
x = 0.01–0.20, and
y = 0.005–0.075

In another aspect, the invention is directed to a dispersion of the above-described composition in an organic medium which can be cast as a dielectric sheet.

In a further aspect, the invention is directed to a dielectric layer made by firing the above-described dielectric sheet to volatilize the organic medium therefrom and to densify the inorganic solids by sintering.

In a still further aspect, the invention is directed to a capacitor comprising a plurality of the above-described dielectric layers interspersed with at least two metal electrode layers.

DETAILED DESCRIPTION

In the present invention, the zinc, niobium and zirconium dopants are included in the barium titanate during its manufacture. A method for preparing the barium titanate is disclosed in copending application, U.S. Ser. No. 07/144,835 and comprises the steps of:

(a) mixing an organometallic compound, or mixture of organometallic compounds, of the structure $TiL_n$, where L is a hydrolyzable group, or a combination of such groups, selected from alkoxy, aryloxy, aminoalkoxy, acetoxy, and acetoacetonyl with a solution of a compound, or a mixture of compounds, of the general structure $BaX_j$, where X is an anion, or a combination of anions, selected from hydroxide, chloride, nitrate and acetate in an alkaline, high turbulence energy environment;

(b) crystallizing the reaction product; and (c) isolating the crystals.

In a particularly preferred embodiment of this method, the barium titanate is prepared by:

(a) reacting tetrabutyl titanate as a first ingredient stream with a solution of barium hydroxide as a second ingredient stream at a temperature of 80°–85° C. in a high turbulence energy environment comprising pumping said ingredient streams simultaneously through a coaxial jet mixer to form a slurry and discharging said slurry into a drownout vessel containing an alkaline heel of water;

(b) crystallizing said slurry by heating under reflux with continuous agitation; and (c) isolating said crystals.

Dopants such as Zr, Nb, and Zn can be incorporated in the barium titanate during its preparation by the partial substitution of tetrabutyl titanate with, for example, a mixture of zirconium n-propoxide, niobium chloride, and anhydrous zinc chloride, as more fully disclosed in the aforementioned copending application.

The dopants substitute for titanium on the titanate crystal lattice as indicated by the appearance of a clean perovskite X-ray diffraction pattern with no evidence of secondary phases. These dopants in combination in appropriate amounts shift the Curie temperature of the barium titanate from about 130° C. for pure barium titanate to below 25° C., preferably to about 5° C. Modified barium titanate particles containing appropriate amounts of dopants have the formula:

$$BaTi_{1-(x+3y/2)}(Zr_xZn_{y/2}Nb_y)O_3$$

wherein x is in the range from 0.01 to 0.20 and y is in the range from 0.005 to 0.075. In preferred particles, x is about 0.07 and y is about 0.027.

An admixture of (1) oxides of calcium, and titanium, precursors thereof, or calcium titanate and (2) manganese oxide, precursors thereof, barium manganate or calcium manganate are added to the modified barium titanate particles. A precursor of a metal oxide is a compound which upon calcining or firing is converted to the metal oxide. These precursors include carbonates, hydroxides and nitrates.

It is well known in the prior art that the inclusion of calcium oxide in doped barium titanate will adjust the width of the Curie peak to decrease the dependence of the dielectric constant on temperature. However, we found that appropriate amounts of calcium could not be included in the doped barium titanate in the above manufacture method because the barium reacted preferentially to the calcium due to greater solubility of barium hydroxide over calcium hydroxide. A mechanical mix of calcium titanate, or precursors such as calcium carbonate and titanium oxide, width of the Curie peak. Unexpectedly, we found the addition inhibited grain growth beneficially during firing and also counteracted the effect of the dopants by moving the Curie peak to a slightly higher temperature. Unfortunately, the modified barium titanate and calcium oxide compositions have an insulation resistance that is too low for practical applications. To raise the insulation resistance, a small amount of manganese oxide, a precursor thereof, barium manganate or calcium manganate is also added. Accordingly, with suitable amounts Zr, Zn and Nb in the barium titanate, and appropriate amounts of calcium titanate and barium or calcium manganate, or precursors, the dielectric material of the invention can be designed with a Curie point below 25° C., a fired grain size less than 5 microns, and a dielectric constant at 25° C. more than 15,000 which decreased by less than about 85% at 85° C.

Instead of mechanically blending the calcium, titanium and manganese additives with the doped barium titanate, the additives can be coated onto the surface of the doped barium titanate powder by the methods described in copending application Ser. No. 07/506,966 which comprise the following steps:

(a) preparing a concentrated stable solution of metal (i.e. additive) chelates;

(b) adding the solution of metal chelates to a dry powder of doped barium titanate at a controlled rate while vigorously stirring the mixture below the liquid limit of the powder; and (c) drying and calcining the powder to decompose metal chelates and remove volatile residues.

The solution of metal chelates is prepared by dissolving a mixture of metal compounds in a concentrated aqueous or aqueous/organic solution of chelating agents. Upon adjustment of the pH, the chelating agent is capable of forming soluble metal chelates with metal ions. Chelating agents increase the solubility of metal compounds in aqueous or aqueous/organic solvents. This enhanced solubility is necessary to obtain an adequate coat when applied to dry powders when applied below the liquid limit of the powder.

The metal chelate solution is added at a controlled rate to the dry barium titanate powder while vigorously stirring below the liquid limit of the powder to obtain a homogeneous distribution on the particles before the solvent evaporates. The liquid limit refers to the water content in weight percent, of a powder comprising ceramic particles at an arbitrarily defined boundary between the liquid and plastic states. The ASTM Standard D4318-84 describes in greater detail the standard test method for liquid limit in reference to soils, and is incorporated herein with reference to powders.

The powder is dried and calcined to decompose the metal chelates and to complete the formation of a homogeneous coating on the barium titanate powder. This procedure results in a more homogeneous distribution of the additives on the surface of the powder, and in lower values of dissipation factor than when the additives are mechanically blended with the doped barium titanate. A preferred additive coating has the following composition (in wt % of the final composition):
0.25–5.0 CaO;
0.25–5.0 TiO2; and
0.025–0.20 MnO.

The barium titanate composition of the invention can be formulated into a dielectric green sheet. One method for forming such sheet comprises casting a dispersion of the ceramic barium titanate composition in a solution of polymeric binder and volatile organic solvent onto a flexible substrate, such as a steel belt or polymeric film, and then heating the cast layer to remove the volatile solvent therefrom.

The organic medium in which the ceramic solids are dispersed consists of the polymeric binder which is dissolved in a volatile organic solvent and, optionally, other dissolved materials such as plasticizers, release agents, dispersing agents, stripping agents, antifouling agents and wetting agents.

To obtain better binding efficiency, it is preferred to use at least 5% wt. polymer binder for 95% wt. ceramic solids. However, it is further preferred to use no more than 20% wt. polymer binder in 80% wt. ceramic solids. Within these limits, it is desirable to use the least possible amount of binder vis-a-vis solids in order to reduce the amount of organics which must be removed by pyrolysis.

In the past, various polymeric materials have been employed as the binder for green sheets, e.g., (poly)vinyl butyral, (poly)vinyl acetate, (poly)vinyl alcohol, cellulosic polymers such as methyl cellulose, ethyl cellulose, hydroxyethyl cellulose, methylhydroxy-ethyl cellulose, atactic polypropylene, polyethylene, silicon polymers such as (poly)methyl siloxane, (poly)methylphenyl siloxane, polystyrene, butadiene/styrene copolymer, polystyrene, (poly)vinyl pyrrolidone, polyamides, high molecular weight polyethers, copolymers of ethylene oxide and propylene oxide, polyacrylamides, and various acrylic acrylates, (poly)lower alkyl methacrylates and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

More recently, Usala, in U.S. Pat. No. 4,613,648 has disclosed an organic binder which is a mixture of compatible multipolymers of 0-100% wt. $C_{1-8}$ alkyl methacrylate, 100-0% wt. $C_{1-8}$ alkyl acryclate and 0-5% wt. ethylenically unsaturated carboxylic acid or amine. Because the polymers permit the use of minimum amounts of binder and maximum amounts of dielectric solids, their use is preferred with the dielectric composition of this invention.

The solvent component of the casting solution is chosen so as to obtain complete solution of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include acetone, xylene, methanol, ethanol, methyl ethyl ketone, 1,1,1-trichloroethane, tetrachloroethylene, amyl acetate, 2,2,4-triethyl pentandiol-1,3-monoisobutyrate, toluene and methylene chloride.

Frequently, the organic medium will also contain a small amount, relative to the binder polymer, of a plasticizer which serves to lower the glass transition temperature (Tg) of the binder polymer. However, the use of such materials should be minimized in order to reduce the amount of organic materials which must be removed when the films cast therefrom are fired. The choice of plasticizers is, of course, determined primarily by the phthalate, dibutyl phthalate, octyl phthalate, butyl benzyl phthalate, alkyl phosphates, polyalkylene glycols, glycerol, (poly)ethylene oxides, hydroxyethylated alkyl phenol, dialkyldithiophosphonate and (poly)isobutylene. Of course, butyl benzyl phthalate is most frequently used in acrylic polymer systems because it can be used effectively in relatively small concentrations.

Multilayer devices such as circuits and capacitors can be fabricated from green dielectric sheets and electrically conductive metallizations. For example, a metallization can be printed in the desired pattern upon a green sheet. The printed sheets are stacked, laminated and cut to form the desired structures. The green assemblage is then fired to effect removal of the organic medium from the metallization material and of the organic binder from the dielectric material. The removal of these materials is accomplished by a combination of evaporation and thermal decomposition during the firing operation.

In some instances, it may also be desirable to interpose a preliminary drying step prior to firing. Conventionally, the thickness of an unfired dielectric sheet is typically about 18-30 microns and upon firing the thickness becomes about 15-25 microns. The present invention, however, allows sheets of thicknesses as small as 10 microns or less to be used.

The desired sintering temperature is determined by the physical and chemical characteristics of the dielectric material. Ordinarily the sintering temperature will be chosen to obtain maximum densification of the dielectric material. However, it will be recognized by those skilled in the art of fabricating electrical devices that maximum densification is not always needed. Therefore, the term "sintering temperature" refers to the temperature (and implicitly the amount of time as well) to obtain the desired degree of densification of the dielectric material for the particular application.

The compositions of the invention sinter to dense ceramic materials at a temperature of about 1240° C. and above, when no fluxing additives are included. However, to reduce the sintering temperature to about 1125° C., zinc borate, or other fluxing agents known in the prior art can be added, or included in the coating on the doped barium titanate, for example by the method described in copending application, U.S. Ser. No. 07/506,964 which comprises the steps of:

(a) mixing zinc borate flux component precursors with Ca, Ti, Mn metal coated barium titanate powder whereby the zinc borate flux component precursors form a uniform coating on each particle; and (b) drying and optionally calcining the coated particles.

One coating method for carrying out this flux coating operation involves blending below the liquid limit of the powder and comprises distributing the flux uniformly on the surface of the metal additive coated barium titanate powder particles by:

(a) adding a concentrated solution of at least one boron and one zinc flux component precursor to the metal coated barium titanate powder while maintaining the pH at a predetermined range to prevent the dissolution of ions from the surface of the barium titanate powder particles;

(b) vigorously stirring the mixture below the liquid limit of the barium titanate powder to uniformly coat the particles with the flux component precursors; and (c) drying and optionally calcining the uniformly coated particles.

A second coating method for carrying out the flux coating operation is surface hydrolysis which comprises distributing the flux uniformly on the surface of the metal coated barium titanate powder particles by:

(a) dispersing a hydroxylated metal coated barium titanate powder in a solution of at least one zinc and one boron flux component hydrolysable precursor in a water immiscible organic solvent;

(b) separating by filtration, centrifugation or decantation and washing the particles; and (c) drying and optionally calcining the uniformly coated particles.

A third coating method for carrying out the flux coating operation is surface nucleation which comprises distributing the flux uniformly on the surface of the metal coated barium titanate powder particles by:

(a) dispersing the metal coated barium titanate powder in water;

(b) adding at a controlled rate either simultaneously or sequentially an aqueous solution of at least one zinc and one boron flux component precursor to the aqueous dispersion while maintaining the pH of the dispersion in the range of from 6.5 to 7.5 and the temperature in the range from 50 to 70° C.;

(c) recovering the barium titanate powder particles; and (d) drying and optionally calcining the uniformly coated particles.

Sintering times also vary with the dielectric composition but ordinarily about 2.5 hours at the sintering temperature is preferred. Upon completion of sintering, the rate of cooling to ambient temperature is carefully controlled in accordance with resistance of the compounds to thermal shock.

In one embodiment of the invention, modified barium titanate and metal oxide additive compositions are formulated into dielectric sheets which are formed into monolithic capacitors. A preferred method for forming such a monolithic capacitor comprises the sequential steps of (1) forming a green dielectric sheet from the above-described composition and an organic binder; (2) applying a layer of conductive electrode material dispersed in an organic medium to each of a plurality of the green sheets; (3) forming an assemblage of alternating layers of green sheets and electrode material; and (4) firing the assemblage at a temperature above 1000° C. to remove the organic medium and organic binder therefrom and to sinter the conductive electrode material and the dielectric material. A monolithic capacitor formed in this manner comprises a ceramic dielectric body having a dielectric constant of at least 10,000 and grain size not larger than microns and at least two spaced metal electrodes in contact with the ceramic body.

EXAMPLES

Example 1

A barium titanate doped with Zr, Zn and Nb and made by the method previously disclosed was used. The nominal ' composition (in parts by wt ) was BaO 64.44, $TiO_2$ 29.71, $ZrO_2$ 3.86, $Nb_2O_5$ 1.51, and ZnO 0.463. The composition obtained by chemical analysis was as follows: BaO 63.79, $TiO_2$ 29.24, $ZrO_2$ 3.84, Nbhd $2O_5$ 1.53, ZnO 0.444, SrO 0.31. The powder had a particle size ($D_{50}$) of 0.4 microns and was calcined at 900° C. for 5 hours. Surface area after calcination was 6.2 $M^2$/ gm. Ceramic tape was made by casting a slurry of an intimate mixture of 96.52 wt% of the doped barium titanate, 1.79% calcium carbonate (1.00% CaO), 1.50% titanium dioxide and 0.20% manganese carbonate (0.12 MnO). The slurry was prepared by milling the powder for 16 hours in 1,1,1-trichloroethane (1 gm per gm of powder) with 2% AB1015 surfactant (E.I. du Pont de Nemours & Co., Inc., Wilmington De. ("Du Pont Co.") and then adding acrylic binder solution (30 gm per 100 gm of powder) and milling for a further 4 hours. The binder solution was a mixture of 91.7% acrylic resin in MEK (5200 binder, Du Pont Co.) and 8.3% butyl benzyl pthalate plasticizer.

The ceramic tape was made into MLC's (EIA size 1209) with six internal electrodes and five active layers, each about 14 microns when fired. A Pd electrode paste (e.g. DuPont 4820D) was used for printing the electrodes. The capacitors were heated slowly to 550° C. to remove the organic binders and the MLC's were fired in zirconia sand at 1240° C. for 2.5 hours. The ceramic of the fired MLC's had a grain size of 2-3 microns. Average capacitance and dissipation factor measured at 0.5 volts were 0.286 microfarads and 2.8%, respectively. Insulation resistance exceeded 100,000 ohm-.farads at 25° C. and averaged 1610 ohm.farads at 125° C. The Curie point was at approximately 10° C. and the deviation in capacitance at 85° C. was −81.5 %. The calculated dielectric constant was 20,500.

Example 2

In this example, the doped powder described above was coated with 1.0% CaO, 1.50% $TiO_2$ and 0.12% MnO by the coating method described previously. The powder was calcined at 700° C. after coating. Green tape and MLC's were made from this coated powder by the method described in Example 1, except that the MLC's were EIA 1206 size and the tape thickness when fired was 10 microns. The MLC's were fired as in Example 1. Grain size of the fired ceramic was again 2-3 microns. Average capacitance was 0.293 microfarads and dissipation factor measured at 0.5 volts was 2.0 %. Insulation resistance exceeded 100,000 ohm.farads at 25° C. and averaged 8300 ohm.farads at 125° C. The Curie point was at about 10° C. and the capacitance deviation at 85° C. was −83%. The calculated dielectric constant was 21,000.

Example 3

This example is similar to Example 2 except that the manganese oxide in the coating was 0.06% instead of 0.12%. Grain size of the fired ceramic was about 1 micron. Average capacitance was 0.326 microfarads and dissipation factor was 2.6 %. Insulation resistance exceeded 100,000 ohm.farads at 25° C. and averaged 3500 ohm.farads at 125° C. The Curie point was at about 10° C. and the capacitance deviation at 85° C. was −84 %. The calculated dielectric constant was 23,000.

Example 4

In this example, the doped barium titanate was coated with zinc borate as disclosed above. The amounts of zinc oxide and boron oxide were nominally 0.78% and 0.22% by wt of the doped barium titanate. Chemical analysis of the zinc and boron present gave 0.79% zinc oxide and 0.19% $B_2O_3$. An intimate mixture of the doped barium titanate coated with zinc borate together with 2.50 wt % calcium milling as described above. Green tape and MLC's were made by a similar process to that described in Example 1, except that the electrode paste was 70% Ag-30% Pd (e.g. Du Pont 4765 or 4803), instead of Pd, and a 1206 size screen was used. After binder burn-out, the MLC's were fired in zirconia sand at 1125° C. for 2.5 hours. The dielectric thickness was 12.5 microns after firing and the grain size was about 3 microns. Average capacitance was 0.324 microfarads and DF was 6.5% measured at 1.0 V. DF was 2.1 measured at 0.1 volt . Insulation resistance averaged 76,000 ohm.farads at 25° C. and 6100 ohm.farads at 125° C. The Curie temperature was at about 10° C. and the capacitance deviation at 85° C. was −86%. The calculated dielectric constant was 25,000.

Example 5

MLC's were made and fired as in Example 4 but no calcium titanate was added to the dielectric composition. The dielectric thickness was 13.5 microns but the grain size was very irregular with some grains being larger than 10 microns. Average capacitance was 0.09 microfarads and DF was 3.4% measured at 1 volt. Insulation resistance was variable and averaged 320 ohm-.farads at 25° C. and 1019 at 125° C., with some capacitors having IR values <1 ohm.farad. This poor reliability was probably related to the presence of large grains in the ceramic. The Curie temperature was at about 0° C. (i.e. lower than when CaO is present) and the capacitance deviation at 85° C. was −70%. The calculated dielectric constant (at 25° C.) was 8,300.

We claim:

1. A composition for forming a densified dielectric body having a Curie Temperature below 25° C., a dielectric constant of at least 10,000 and grain size of 5 microns or less, the composition compirising:
    (a) finely divided particles of modified barium titanate; and
    (b) an admixture of (1) oxides of calcium, and titanium, precursors thereof, or calcium titanate and (2) manganese oxide, precursors thereof, barium manganate or calcium manganate; the admixture comprising in wt. % of the composition:
    0.25–5.0 wt. % CaO;
    0.25–5.0 wt. % $TiO_2$; and
    0.025–0.20 wt. % MnO;

the modified barium titanate particles containing Zr, Zn and Nb homogeneously distributed on an atomic scale throughout the particles according to the formula:

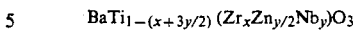

$$BaTi_{1-(x+3y/2)}(Zr_xZn_{y/2}Nb_y)O_3$$

wherein
    x = 0.01–0.20 and
    y = 0.005–0.075.

2. The composition of claim 1 wherein the admixture of oxides or precursors thereof is coated on the surface of the modified barium titanate particles.

3. The composition of claim 2 wherein x = 0.07 and y = 0.027.

4. The composition of claim 1 further comprising a zinc borate fluxing agent.

5. The composition of claim 1 further comprising an organic medium containing a solution of volatile organic solvent and organic polymeric binder.

6. A dielectric sheet comprising a cast layer of the composition of claim 5 which has been heated to remove the volatile organic solvent.

7. A dielectric ceramic layer comprising the sheet of claim 6 which has been fired to volatilize the organic medium therefrom and to densify the inorganic components by sintering.

* * * * *